US009403180B2

(12) United States Patent
Ha et al.

(10) Patent No.: US 9,403,180 B2
(45) Date of Patent: Aug. 2, 2016

(54) NANOPOSITIONING SUBSTRATE PREPARATION APPARATUS AND PREPARATION METHOD USING DIP PEN NANOLITHOGRAPHY WITH A SINGLE TIP OR MULTIPLE TIPS USING ATOMIC FORCE MICROSCOPE (AFM)

(75) Inventors: Tai-Hwan Ha, Daejeon (KR); Jee-Eun Park, Daejeon (KR)

(73) Assignee: Korea Research Institute of Bioscience and Biotechnology, Daejeon (KR)

( * ) Notice: Subject to any disclaimer, the term of this patent is extended or adjusted under 35 U.S.C. 154(b) by 196 days.

(21) Appl. No.: 14/125,808

(22) PCT Filed: May 21, 2012

(86) PCT No.: PCT/KR2012/003994
§ 371 (c)(1),
(2), (4) Date: Dec. 12, 2013

(87) PCT Pub. No.: WO2012/173343
PCT Pub. Date: Dec. 20, 2012

(65) Prior Publication Data
US 2014/0134336 A1 May 15, 2014

(30) Foreign Application Priority Data
Jun. 13, 2011 (KR) ........................ 10-2011-0057070

(51) Int. Cl.
*B05B 15/02* (2006.01)
*B05C 11/10* (2006.01)
(Continued)

(52) U.S. Cl.
CPC . *B05C 11/00* (2013.01); *B05D 5/00* (2013.01); *B81C 99/0025* (2013.01); *G03F 7/0002* (2013.01); *B82Y 10/00* (2013.01); *G01Q 80/00* (2013.01)

(58) Field of Classification Search
USPC .......... 118/300, 302, 313–315, 712; 427/256, 427/265
See application file for complete search history.

(56) References Cited

U.S. PATENT DOCUMENTS

| 7,491,422 B2 | 2/2009 | Zhang et al. |
| 2002/0063212 A1 | 5/2002 | Mirkin et al. |

(Continued)

FOREIGN PATENT DOCUMENTS

| KR | 10-2003-0066327 | 8/2003 |
| KR | 10-2006-0052557 | 5/2006 |

(Continued)

OTHER PUBLICATIONS

Li et al., "Study of overlay metrology in atomic force microscope lithography (overlaying lithography with atomic force microscope)", Journal of Vacuum Science & Technology B, Nov./Dec. 2006, vol. 24, No. 6, p. 3101-3104.

(Continued)

*Primary Examiner* — Yewebdar Tadesse
(74) *Attorney, Agent, or Firm* — H.C. Park & Associates, PLC

(57) ABSTRACT

Provided are method and apparatus to nanoposition ink, the apparatus including: a substrate; a pattern index; an atomic force microscope (AMF) tip configured to form a pattern on the pattern index; a first ink reservoir including a first ink; a second ink reservoir including a second ink; a first cleaning portion configured to remove the first ink from the AMF tip; a second washing portion configured to remove the second ink from the AMF tip; a position determining portion configured to interact with the AMF tip; an electrode connection portion configured to apply a voltage to the position determining portion, in order to determine a position of the AMF tip when the AMF tip interacts with the position determining portion. The AMF tip is configured to configured to interact with the position determining portion, prior to forming the pattern using the first and second inks.

18 Claims, 16 Drawing Sheets

(51) Int. Cl.
  *B05B 7/06* (2006.01)
  *B05D 1/36* (2006.01)
  *B05C 11/00* (2006.01)
  *B81C 99/00* (2010.01)
  *B05D 5/00* (2006.01)
  *G03F 7/00* (2006.01)
  *B82Y 10/00* (2011.01)
  *G01Q 80/00* (2010.01)

(56) References Cited

U.S. PATENT DOCUMENTS

2003/0157254 A1* 8/2003 Mirkin ............... B82B 3/00
427/372.2
2004/0026007 A1* 2/2004 Hubert ............... B82B 3/00
156/64
2008/0044775 A1 2/2008 Hong et al.
2009/0143246 A1 6/2009 Mirkin et al.
2011/0274839 A1* 11/2011 Fragala ............ B81C 1/00031
427/265

FOREIGN PATENT DOCUMENTS

KR 10-2007-0029151 3/2007
KR 10-2010-0040293 4/2010

OTHER PUBLICATIONS

International Search Report issued on Dec. 21, 2012 in the International Application No. PCT/KR2012/003994.

* cited by examiner

NANOPOSITIONING SUBSTRATE PREPARATION APPARATUS AND PREPARATION METHOD USING DIP PEN NANOLITHOGRAPHY WITH A SINGLE TIP OR MULTIPLE TIPS USING ATOMIC FORCE MICROSCOPE (AFM)

CROSS-REFERENCE TO RELATED APPLICATIONS

This application is the National Stage entry of International Application PCT/KR2012/003994 filed on May 21, 2012, and claims the benefit of priority from Korean Patent Application No. 10-2011-0057070, filed on Jun. 13, 2011, which are incorporated herein by reference for all purposes as if fully set forth herein.

BACKGROUND OF THE INVENTION

1. Field

The present invention relates to a method for preparing nano/micro array and acquiring nanopatterning image using an atomic force microscope (AFM), and more specifically, is to an apparatus for preparing nanopositioning substrate using dip pen nanolithography with a single tip or multiple tips using ATM, and a method of using the apparatus for preparing a nanopositioning substrate and a method for preparing a nano/micro array and acquiring a nanopatterning image using the same.

2. Discussion of the Background

Conventional dip-pen nanolithography-applied researches have worked on the issue of immobilizing DNA, proteins, and antibodies on a substrate surface to form a nanoarray, and maintaining activity of the biopolymer immobilized on the surface.

However, as well known, the biopolymers such as DNA or proteins, when used as ink, are less interactive with substrate and have deteriorated immobilization efficiency.

Further, despite some advantages of preparing biochip using dip-pen nanolithography, such as increased density level (several tens of million times greater density compared to currently available biochip system), the disadvantageous need for the preparation of inkwells in the amount and size corresponding to the AFM tips and for loading independent contents in the respective nano-wells to load independent contents on the respective ATM tips, causes the actual application to be excessively costly. As a result, while there are many reports on experiments where one type of protein or DNA is repeatedly written, the practical nanoscale biochip has not been achieved so far.

Further, the conventional method for the preparation of multiple tips mainly include preparing approximately 55,000 multiple tips, or preparing nanoarrays using only one ink solution for the 55,000 tips, and yet, layering a variety of contents has not been accomplished so far.

Meanwhile, apart from the above, research has been carried out on the preparation of cantilever array integrating approximately one million ATM tips, and this way of mass producing a single tip or multiple tip models can surely provide an advantage of increased is productivity of dip-pen nanolithography. However, as far as it concerns the condition to produce ten thousands of wafers, the productivity of the optical lithography is still incomparable.

In other words, even though several millions of multiple tip systems are possible, without sufficient position reproducibility, that is, without the ability of the individual AFM tips to return to original positions after pattern formation, biochips with extra high density can hardly be achieved.

However, the current technologies require that the respective spots be maintained at several μm spacing to prevent cross-contamination of the ink. For example, in the case of a bio array, the patterned individual spots are limited within at least several μm spacing, and this also has close relationship with the position reproducibility.

In the latest optical lithography nanopositioning technology which is generally applied to electronic engineering, the position reproducibility of several nanometers can be achieved with piezoelectric elements fixed to a silicon or glass substrate. In this case, the nanometer-scale position reproducibility is achieved using the alignment markers formed on the substrate and a photomask, respectively, or using the interference phenomena of the grating patterns to be more specific.

However, none has successfully incorporated the nanopositioning using AFM to a coherent process that can achieve position reproducibility from a scale of several $mm^2$ to a scale less than several hundred nanometers.

That is, in the laboratory scale, one suggestion was to mark small marker patterns (in several dozen nanometers in size) using AFM in advance, replace with other AFM tips loaded with different ink, and find the previously marked positions (using AFM imaging) to achieve nanopatterns.

However, the above process requires as an essential process the AFM imaging to find the previously patterned markers, during which contamination of the surface having markers thereon by the ink on the AFM tip frequently occurs.

Therefore, in order to prevent problem of cross-contamination associated with the replacement of inks in the preparation of nanoarrays using several dozens to several hundreds of inks with dip-pen nanolithography using different ink molecules, it is necessary to maintain the respective nanoarrays at a spacing of several hundred nanometers and several micrometers.

To sum up, the currently available technologies still suffer greatly deteriorating efficiency in the preparation of extra high density arrays using extra high density nanoarrays with dip-pen nanolithography using AFM.

That is, generally, the substrate for the purpose of AFM is operated by a piezo-motor (taking x-axis for example, the maneuver margin ranges between several hundred nm and several hundred μm), but the position deviates from a range of several hundred nm and several hundred μm, exceeding the operating area of the piezo-motor in the process of replacing AFM tips. Accordingly, the limited position reproducibility is considered to be the main problem to be tackled with in the preparation of extra high density nanoarary.

Even if the operation is performed within the operational limit of the piezo-motor (without having to replace ATM tips), considering hysteresis, which characteristically occurs in the piezo-motor during repetitive operations, the deviation of the position by a range of several tens or hundreds of nanometers is inevitable.

Therefore, the ability to repetitiously align the AFM tips under several nanometer scale precision is considered to be the bottle neck technology to the mass production of biochips or extra high density biochips.

That is, in order to solve the problems associated with the prior art, in the mass production of biochips or preparation of extra high density biochips, an apparatus or a method is necessary, which can repetitiously align the AFM tips under several nanometer scale precision, but none has been able to provide the apparatus or method that can meet such demands.

SUMMARY

The present invention has been made to solve the problems mentioned above, and accordingly, it is an object of the present invention to provide a nanopositioning substrate preparation apparatus using a single tip or multiple tips for dip-pen nanolithography using an atomic force microscope (AFM), which enables production of extra high density nanoarrays, notwithstanding the fact that the general AFM is used, by preparing a substrate including three-dimensional (3D) nanostructures and ink reservoirs, without having to perform AFM imaging (i.e., pre-scanning) in the dip-pen nanolithography, and a preparation method thereof.

It is another object of the present invention to provide a nanopositioning substrate preparation apparatus using a single tip or multiple tips for dip-pen nanolithography using AFM, which is capable of aligning AFM tips with respect to three dimensional (3D) nanostructures, such as conical structures, in a contactless manner, by coating the 3D nanostructures with gold/silver electrodes and considering changes in electric current or bending degree of the AFM tips, due to the application of voltage to the AFM tips and the gold/silver electrodes, and a preparation method thereof.

It is yet another object of the present invention to provide a nanopositioning substrate preparation apparatus using a single tip or multiple tips for dip-pen nanolithography using AFM, which allows easy ink replacement of the a single AFM tip or multiple AFM tips, by is coating gold electrodes with hydrogel, so as to use external gold electrodes arranged for dip-pen nanolithography as ink reservoirs, and a preparation method thereof.

It is yet another object of the present invention to provide a nanopositioning substrate preparation apparatus using a single tip or multiple tips for dip-pen nanolithography using AFM, which includes a process for facilitating tip cleaning process using a hydrogel, so as to enable recycle of AFM tips, and a preparation method thereof.

Further, it is yet another object of the present invention to provide a nanopositioning substrate preparation apparatus using a single tip or multiple tips for dip-pen nanolithography using AFM, which is capable of nano-scale alignment by preparing external electrode patterns and three dimensional (3D) nanostructures on a glass substrate, and a preparation method thereof.

In order to achieve the above objects, a nanopositioning substrate preparation apparatus using a single tip for dip-pen nanolithography using atomic force microscope (AFM) is provided, which may include a substrate, an AFM tip configured to write a pattern on the substrate, a first ink reservoir configured to load the AFM tip with ink, a position determining portion configured to check a position of the ink-loaded AFM tip or to determine a position to which the ink-loaded AFM tip is to be moved, a pattern index configured to write a pattern on the substrate with the ink-loaded AFM tip, a first cleaning portion configured to clean the ink-loaded ~~4~~ tip after the pattern is written at the pattern index, a second ink reservoir configured to re-load ink on the AFM tip cleaned at the first cleaning portion, a second cleaning portion configured to re-clean the AFM tip after the pattern is written at the pattern index, using the AFM tip re-loaded with ink of the second ink reservoir, and an electrode connecting portion configured to apply a voltage to the AFM tip and the position determining portion.

The first and second ink reservoirs load compounds include ink on the AFM tip, the compounds stored in the first and second ink reservoirs are identical or different types of compounds, and the compounds may include ink, low molecular weight compound or biopolymer material comprising DNA or protein.

The first and second ink reservoirs may be composed of two or more ink reservoirs to be able to repeat loading the compounds on the AFM tip to ensure that the compounds are loaded, or to adjust an amount of ink loaded on the AFM tip.

The position determining portion may play a role of an origin for the ink-loaded AFM tip by forming a reference position on the substrate, in order to implement position reproducibility of the AFM tip which is moved to a position with a pattern previously formed thereon and then move to a desired position, and the position determining portion is able to index or pattern densely at an area of the pattern index which is between several μm and several tens of μm in size, by checking positions based on voltage-current change, bending degree of the AFM tip according to voltage, and AFM image and checking origin whenever it is necessary to replace ink using the AFM tip which is aligned, and also is able to index or layer at the same position without interval.

The reference position of the position determining portion may be formed as a three dimensional nanostructure which is in a form of cone, quadrangular pyramid, triangular pyramid, or cylinder, the nanostructure may be configured as a gold (Au), silver (Ag) or copper (Cu) electrode, and by forming a hydrogel on the Au, Ag or Cu electrode formed on the first ink reservoir and the second ink reservoir, cleaning of the AFM tip and loading with new ink are possible, by transfer of the ink in accordance with voltage-current adjustment.

The pattern index and the position determining portion may be so configured as is to form a gold electrode to connect to an external power source, using a commercially available E-beam evaporator.

The first and second cleaning portions may include two or more cleaning portions to repeatedly cleaning the AFM tip to thus allow easy loading of next ink, the first and second cleaning portions may perform cleaning of the AFM tip using aqueous solution or organic solvent, in which the cleaning process of removing the previously loaded ink may be facilitated by application of voltage, or new type of compound may be prepared as a result of reaction between specific biomaterials, or biopolymer material used as the ink may be transformed chemically or physically.

The electrode connection portion may be connected to an electric line using conductive adhesive or soldering, to thus connect to an external power source to apply voltage to the first and second cleaning portions and the first and second ink reservoirs.

The substrate may include silicon, silicon rubber, silicon resin, polydimethylsiloxane or glass substrate, and the substrate may include a protrusion or a recess formed thereon.

In one embodiment, a nanopositioning substrate preparation method is provided, which uses a nanopositioning substrate preparation apparatus using a single tip for dip-pen nanolithography using atomic force microscope (AFM) including a substrate, an AFM tip, a position determining portion configured to check a position of the ink-loaded AFM tip or to determine a position to which the ink-loaded AFM tip is to be moved, a pattern index configured to write a pattern on the substrate with the ink-loaded AFM tip, a first cleaning portion configured to clean the ink-loaded AFM tip after the pattern is written at the pattern index, a second ink reservoir configured to re-load ink on the AFM tip cleaned at the first cleaning portion, a second cleaning portion configured to re-clean the AFM tip after the pattern is written at the pattern index, using the AFM tip re-loaded with ink of the second ink reservoir, and an electrode connecting portion configured to apply a voltage to the AFM tip and the position determining portion, the nanopositioning substrate preparation method capable of forming a dense pattern in a limited area of the pattern index using a variety of inks, in which the nanopositioning substrate preparation method may include positioning the AFM tip at the first ink reservoir and loading ink on the AFM tip, moving the ink-loaded AFM tip to the position determining portion using a nanostage and checking an origin, moving the AFM tip with reference to the origin as checked by the position determining portion and writing an intended pattern on the substrate at the pattern index using a principle of dip-pen nanolithography, moving the AFM tip with pattern formed thereon to the first cleaning portion to clean the AFM tip, bringing the cleaned AFM tip to a contact with the second ink reservoir and loading second ink comprising new compound or biopolymer material on the AFM tip, moving the AFM tip loaded with the new compound at the second ink reservoir to the position determining portion using the nanostage to check the origin, moving the AFM tip with reference to the checked origin to the pattern index, and writing an intended pattern at a proximity to the previous pattern or at the same position on the substrate using the newly loaded ink, moving the AFM tip after forming the pattern, to the second cleaning portion to clean the same, and repeating the above-mentioned processes until an intended pattern is completed.

The first and second ink reservoirs may include two or more ink reservoirs to repeatedly load compounds to ensure that the compounds are loaded on the AFM tip, or to adjust an amount of ink loaded on the AFM tip, the compounds stored at the first and second ink reservoirs are same or different types from each other, or comprise ink, or low molecular weight is compound or biopolymer material comprising DNA or protein, and the loading the AFM tip with the ink at the first and second ink reservoirs may additionally include loading again after the ink loading on the AFM tip to ensure that the ink is loaded, or adjusting an amount of the ink loaded on the AFM tip.

The position determining portion may include a reference position formed as a three dimensional nanostructure which is in a form of cone, quadrangular pyramid, triangular pyramid, or cylinder, the nanostructure is configured as a gold (Au), silver (Ag) or copper (Cu) electrode, and checking the origin may include driving a nanostage in accordance with electric current characteristic from a voltage applied to the AFM tip and the position determining portion, or bending degree of the AFM tip, to place the AFM tip to a tip of the conical nanostructure of the position determining portion in a contactless manner, or checking the origin by acquiring an AFM image of a proximity of the position determining portion in a contact manner and placing the AFM tip to a tip of the conical nanostructure.

The pattern index and the position determining portion may include a gold electrode formed to connect to an external power source, using a commercially available E-beam evaporator.

The AFM tip cleaning may include repeatedly cleaning the AFM tip with the first and second cleaning portions which comprise two or more cleaning portions to increase ease of performing next ink loading, the AFM tip cleaning may be performed by a contact between the first and second cleaning portions having droplets of organic solvent or aqueous solution formed thereon, with the electrode, and the cleaning process may be facilitated by applying voltage between the first and second cleaning portions and the AFM tip.

The electrode connection portion to connect to an external power to apply voltage is to the first and second cleaning portions and the first and second ink reservoirs, may be so configured to be connected to a commercially available electric line using conductive adhesive or soldering.

The substrate may include silicon, silicon rubber, silicon resin, polydimethylsiloxane or glass substrate, and the substrate may include a protrusion or a recess formed thereon.

In one embodiment, a nanopositioning substrate preparation apparatus using multiple tips for dip-pen nanolithography using atomic force microscope (AFM) is provided, which may include a substrate, two or more AFM tips configured to write a pattern on the substrate, two or more first ink reservoirs configured to correspond to the AFM tips to load the AFM tips with ink, two or more position determining portions configured to correspond to the AFM tips to check positions of the ink-loaded AFM tips or to determine positions to which the ink-loaded AFM tips are to be moved, pattern indexes configured to write a pattern on the substrate with the ink-loaded AFM tips, two or more first cleaning portions configured to correspond to the AFM tips to clean the ink-loaded AFM tips after the pattern is written at the pattern index, two or more second ink reservoirs configured to correspond to the AFM tips to re-load ink on the AFM tips cleaned at the first cleaning portions, two or more second cleaning portions configured to correspond to the AFM tips to re-clean the AFM tips after the pattern is written at the pattern index, using the AFM tips re-loaded with ink of the second ink reservoirs, and two or more electrode connecting portions configured to correspond to the AFM tips to apply a voltage to the AFM tips and the position determining portions.

The first and second ink reservoirs load compounds including ink on the AFM tips, the compounds stored in the first and second ink reservoirs are identical or different types of compounds, and the compounds comprise ink, low molecular weight compound or biopolymer material comprising DNA or protein.

The first and second ink reservoirs may be composed of two or more ink reservoirs to be able to repeat loading the compounds on the AFM tips to ensure that the compounds are loaded, or to adjust an amount of ink loaded on the AFM tips.

The position determining portions may each play a role of an origin for the ink-loaded AFM tips by forming a reference position on the substrate, in order to implement position reproducibility of the AFM tips which are moved to positions with a pattern previously formed thereon and then move to a desired position, and the position determining portions are able to index or pattern densely at an area of the pattern index which is between several μm and several tens of μm in size, by checking positions based on voltage-current change, bending degree of the AFM tips according to voltage, and AFM image, and checking the origin whenever it is necessary to replace ink using the AFM tips that are aligned, and also are able to index or layer at the same position without interval.

The reference positions of the position determining portions may each formed as a three dimensional nanostructure which is in a form of cone, quadrangular pyramid, triangular pyramid, or cylinder, the nanostructure is configured as a gold (Au), silver (Ag) or copper (Cu) electrode, and by forming a hydrogel on the Au, Ag or Cu electrode formed on the first ink reservoir and the second ink reservoir, cleaning of the AFM tip and loading with new ink are possible, by transfer of the ink in accordance with voltage-current adjustment.

The pattern index and the position determining portions may be so configured as to form a gold electrode to connect to an external power source, using a commercially available E-beam evaporator.

The first and second cleaning portions may include two or more cleaning portions to repeatedly cleaning the AFM tips to thus allow easy loading of next ink, the first and second cleaning portions may perform cleaning of the AFM tips using aqueous solution or organic solvent, in which the cleaning process of removing the previously loaded ink may be facilitated by application of voltage, or new type of compound may be prepared as a result of reaction between specific biomaterials, or biopolymer material used as the ink may be transformed chemically or physically.

The electrode connection portions may each be connected to an electric line using conductive adhesive or soldering, to thus connect to an external power source to apply voltage to the first and second cleaning portions and the first and second ink reservoirs.

The substrate may include silicon, silicon rubber, silicon resin, polydimethylsiloxane or glass substrate, and the substrate may include a protrusion or a recess formed thereon.

In one embodiment, a nanopositioning substrate preparation method is provided, which may use a nanopositioning substrate preparation apparatus using multiple tips for dip-pen nanolithography using atomic force microscope (AFM) comprising a substrate; two or more AFM tips configured to write a pattern on the substrate; two or more first ink reservoirs configured to correspond to the AFM tips to load the AFM tips with ink; two or more position determining portions configured to correspond to the AFM tips to check positions of the ink-loaded AFM tips or to determine positions to which the ink-loaded AFM tips are to be moved; pattern indexes configured to write a pattern on the substrate with the ink-loaded AFM tips; two or more first cleaning portions configured to correspond to the AFM tips to clean the ink-loaded AFM tips after the pattern is written at the pattern index; two or more second ink reservoirs is configured to correspond to the AFM tips to re-load ink on the AFM tips cleaned at the first cleaning portions; two or more second cleaning portions configured to correspond to the AFM tips to re-clean the AFM tips after the pattern is written at the pattern index, using the AFM tips re-loaded with ink of the second ink reservoirs; and two or more electrode connecting portions configured to correspond to the AFM tips to apply a voltage to the AFM tips and the position determining portions, in which the nanopositioning substrate preparation method may include positioning the AFM tips at the first ink reservoirs and loading ink on the AFM tips, moving the ink-loaded AFM tips to the position determining portions using a nanostage and checking origins, moving the AFM tips with reference to the origins as checked by the position determining portions and writing an intended pattern on the substrate at the pattern index using a principle of dip-pen nanolithography, moving the AFM tips with pattern formed thereon to the first cleaning portions to clean the AFM tips, bringing the cleaned AFM tips to a contact with the second ink reservoirs and loading second ink comprising new compound or biopolymer material on the AFM tips, moving the AFM tips loaded with the new compound at the second ink reservoirs to the position determining portions using the nanostage to check the origins, moving the AFM tips with reference to the checked origins to the pattern index, and writing an intended pattern at a proximity to the previous pattern or at the same position on the substrate using the newly loaded ink, moving the AFM tips after forming the pattern, to the second cleaning portions to clean the same, and repeating the above-mentioned processes until an intended pattern is completed.

The first and second ink reservoirs may include two or more ink reservoirs to repeat loading compounds to ensure that the compounds are loaded on the AFM tips, or to adjust an amount of ink loaded on the AFM tips, the compounds stored at the first and second ink is reservoirs are same or different types from each other, the compounds may include ink, or low molecular weight compound or biopolymer material comprising DNA or protein, and the loading the AFM tip with the ink at the first and second ink reservoirs may additionally include loading again after the ink loading on the AFM tips to ensure that the ink is loaded, or adjusting an amount of the ink loaded on the AFM tips.

The position determining portions each may include a reference position formed as a three dimensional nanostructure which is in a form of cone, quadrangular pyramid, triangular pyramid, or cylinder, the nanostructure is configured as a gold (Au), silver (Ag) or copper (Cu) electrode, and checking the origins may include driving a nanostage in accordance with electric current characteristic from a voltage applied to the AFM tip and the position determining portion, or bending degree of the AFM tips, to place the AFM tips to a tip of the conical nanostructure of the position determining portion in a contactless manner, or checking the origins by acquiring an AFM image of a proximity of the position determining portion in a contact manner and placing the AFM tips to a tip of the conical nanostructure.

The pattern index and the position determining portions may each include a gold electrode formed to connect to an external power source, using a commercially available E-beam evaporator.

The AFM tip cleaning may include repeatedly cleaning the AFM tips with the to first and second cleaning portions which comprise two or more cleaning portions to increase ease of performing next ink loading, the AFM tip cleaning may be performed by a contact between the first and second cleaning portions having droplets of organic solvent or aqueous solution formed thereon, with the electrode, and the cleaning process may be facilitated by applying voltage between the first and second cleaning portions and the AFM tips.

The electrode connection portions to connect to an external power to apply voltage to the first and second cleaning portions and the first and second ink reservoirs, may be so configured to be connected to a commercially available electric line using conductive adhesive or soldering.

The substrate may include silicon, silicon rubber, silicon resin, polydimethylsiloxane or glass substrate, and the substrate may include a protrusion or a recess formed thereon.

As explained above, according to the present invention, since multiple biomaterials are integrated in the glass substrate using position reproducibility of the AFM tips, a nanopositioning substrate preparation apparatus using a single tip or multiple tips for dip-pen nanolithography using AFM and a preparation method thereof according to the present invention can increase density of the biomaterials at an area of µm scale.

Further, according to the present invention, a nanopositioning substrate preparation apparatus using a single tip or multiple tips for dip-pen nanolithography using AFM and a preparation method thereof are provided, from which a large area (to 20 mm) nanopositioning system can be commercialized, which may have glass substrate patterned with gold electrode and interoperable with AFM.

Furthermore, according to the present invention, a nanopositioning substrate preparation apparatus using a single tip or multiple tips for dip-pen nanolithography using AFM and a preparation method thereof are provided, which enables actual implementation of an extra high density and very high capacity biochip.

Furthermore, according to the present invention, a nanopositioning substrate preparation apparatus using a single tip or multiple tips for dip-pen nanolithography using AFM and a preparation method thereof are provided, which enable re-alignment of positions of target biomolecules for the purpose of study on new properties.

Furthermore, according to the present invention, a nanopositioning substrate preparation apparatus using a single tip or multiple tips for dip-pen nanolithography using AFM and a preparation method thereof are provided, which can enable interaction among biomolecules in the field such as biochemistry, biology or neuroscience, by providing a platform to observe interaction among a variety of biomolecules immobilized on a glass substrate in real time basis.

DETAILED DESCRIPTION OF THE ILLUSTRATED EMBODIMENTS

Hereinbelow, a nanopositioning substrate preparation apparatus using a single tip or multiple tips for dip-pen nanolithography using AFM and a preparation method thereof according to various embodiments will be explained with reference to the accompanying drawings.

As explained below, the embodiments propose a nanopositioning substrate preparation apparatus using a single tip or multiple tips for dip-pen nanolithography using AFM and a preparation method thereof, and a method based on the above, for preparing nanoarrays or nanopatterns using dip-pen nanolithography and acquiring AFM images.

The embodiments are provided herein solely for the purpose of illustration and explanation, and not to be construed as limiting.

Further, the terminology used herein is selected in consideration of the functions applied in certain embodiments of the invention. Therefore, certain terms or expressions may have different meaning depending on intension of a user or an operator, or precedent cases, and while the terms used herein will be understood according to specific definition given herein, the is other terms without specific definition mentioned herein will be interpreted as being generally understood by those skilled in the art.

Hereinbelow, the nanopositioning substrate preparation apparatus using a single tip or multiple tips for dip-pen nanolithography using AFM and the preparation method thereof according to various embodiments will be explained with reference to accompanying drawings.

Figure 1:
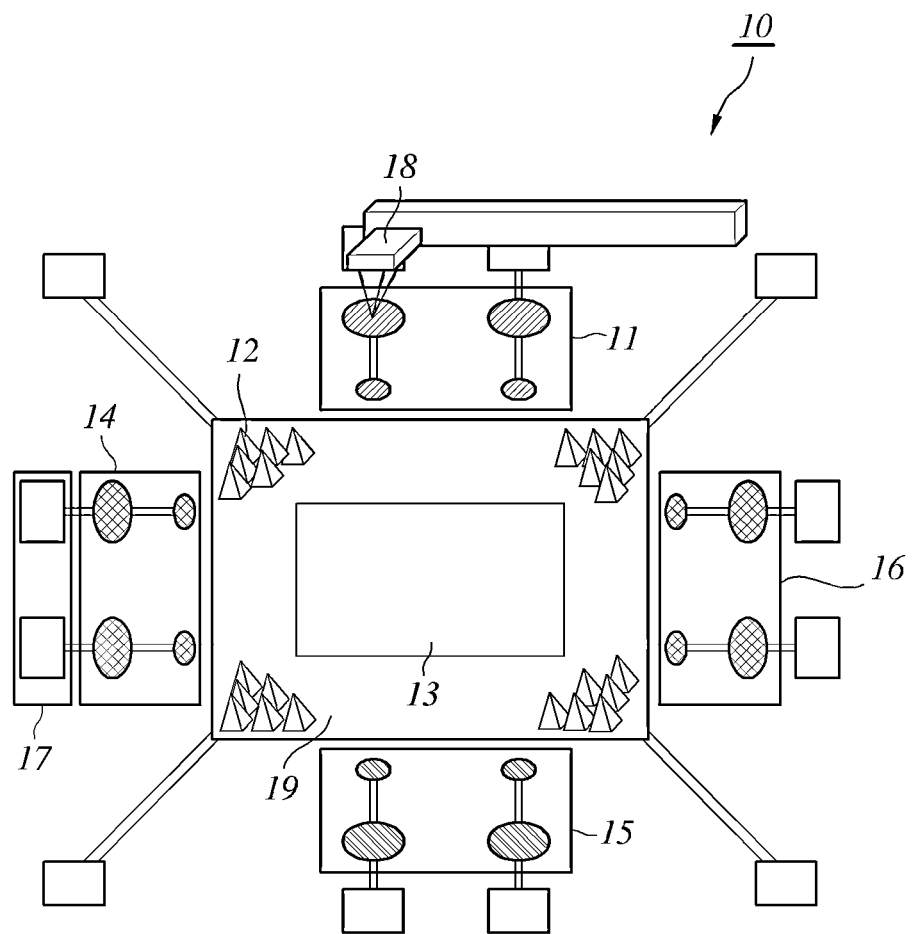
FIG. 1 is a schematic diagram of an overall constitution of a nanopositioning substrate preparation apparatus using a single tip for dip-pen nanolithography, according to a first embodiment.

FIG. 1 is a schematic view of the constitution of the nanopositioning substrate preparation apparatus using a single tip in the dip-pen nanolithography according to the first embodiment.

Referring to FIG. 1, the nanopositioning substrate preparation apparatus 10 using a single tip in the dip-pen nanolithography according to the first embodiment may include a first ink reservoir 11 configured to coat an AFM tip 18 with ink, a position determining portion 12 configured to find the position of the ink-coated AFM tip or determine next positions of the ink-coated AFM tip 18, a pattern index 13 where the patterns are written on the substrate with the ink-coated AFM tip 18, a first cleaning portion 14 configured to clean the ink-coated AFM tip 18 used for the pattern writing on the pattern index 13, a second ink reservoir 15 configured to re-coat the cleaned AFM tip 18 from the first cleaning portion with ink, a second cleaning portion configured to re-clean the AFM tip 18 after the ink-coated AFM tip 18 of the second ink reservoir is used to print the patterns on the pattern index again, and an electrode connector 17 configured to apply voltage to the AFM tip (18) and the position determining portion.

The first ink reservoir 11 is provided to coat the AFM tip 18 with ink compound, in which the compound may use the same or different ink or biopolymer or low molecular weight compound.

The position determining portion 12 is provided to accomplish position reproducibility, and therefore, it plays a role of an origin for the AFM tip 18 to return to, after completing ink loading.

To be specific, the position determining portion 12 is provided as an origin, so that after repetitiously moving a distance of several mm between the first and second ink reservoirs 11, 15 and the first and second cleaning portions 14, 16, and prior to performing the dip-pen nanolithography at the pattern index 13, the AFM tip 18 can return to the locations where the patterns have previously been formed.

Further, the position determining portion 12 determines the position depending on the variations in voltage-current, and determines the position of the AFM tip 18 in a contactless manner, in accordance with the characteristic of the current flowing in the electrode, according to the voltage applied to the AFM tip 18 and the conical or quadrangular pyramid-shaped nanostructure.

That is, referring to FIG. 1, the position determining portion 12 includes conical or quadrangular pyramid-shaped nanostructures which may be coated with gold (Au)/silver (Ag)/copper (Cu) electrodes.

Hydrogel may be formed on top of gold (Au)/silver (Ag)/copper (Cu) electrodes of the first ink reservoir 11 and the second ink reservoir 15, to enable tip cleaning and loading of new ink (biomaterial or low molecular weight compound) by means of biomaterial (ink) transport in accordance with voltage-current adjustment.

Further, the pattern index 13 is where desired nanoarray or nanopattern is written on the substrate 19 with dip-pen nanolithography, using AFM tips 18 aligned at the origin and loaded with a variety of inks. This is where the nanopatterns or nanoarrays are actually written and utilized like biochips.

The pattern index 13 and the position determining portion 12 may have gold electrodes to connect to an external power source, using a commercially available E-beam evaporator.

As explained above, because it is possible to find the origin in each and every ink replacement using the aligned AFM tip 18, it is possible to form dense index or patterns in the area of the pattern index 13, which is several µm to several µm in size, and thus, indexing or layering at the identical positions is enabled.

Next, the first cleaning portion 14 is where the ink-coated tip is cleaned, and the cleaning of removing previously-loaded ink may be facilitated by applying voltage, or new type of compound may be prepared through reaction with a specific bio material, or chemical or physical transformation of the biopolymer material used as the ink may be possible.

Further, the second ink reservoir 15 is configured in a similar manner as the first ink reservoir 11, to form nanoarrays using new type of ink at a position identical to the previously-indexed position on the substrate 19 or in proximity (within several nanometers) thereto, or to layer ink molecules on the AFM tips 18.

The second cleaning portion 16 is used to write ink on desired positions on the substrate 19 or clean the same, and may be used in combination with the first cleaning portion 14.

The cleaning of the AFM tip 18 with the first and second cleaning portions 14, 16 may be performed using aqueous solution or organic solvent.

Further, the electrode connecting portion 17 is configured to connect to an external power source to apply voltage to the first and second cleaning portions 14, 16 and the first and second ink reservoirs 11, 15, and may be formed using conductive adhesive or soldering is to be able to connect to commercially available power line.

Further, a plurality of patterns may be formed on the substrate 19, using silicon, silicon rubber, silicon resin, polydimethylsiloxane, or glass substrate.

The plurality of pattern areas may be formed on the substrate 19 as protrusions or recesses.

Using the nanopositioning substrate preparation apparatus 10 explained above, it is possible to form precise nanopattern using a variety of inks with single AFM tip, or layer a variety of materials on identical position, by repeating the processes to be explained below with reference to FIGS. 2 and 3.

Figure 2A:
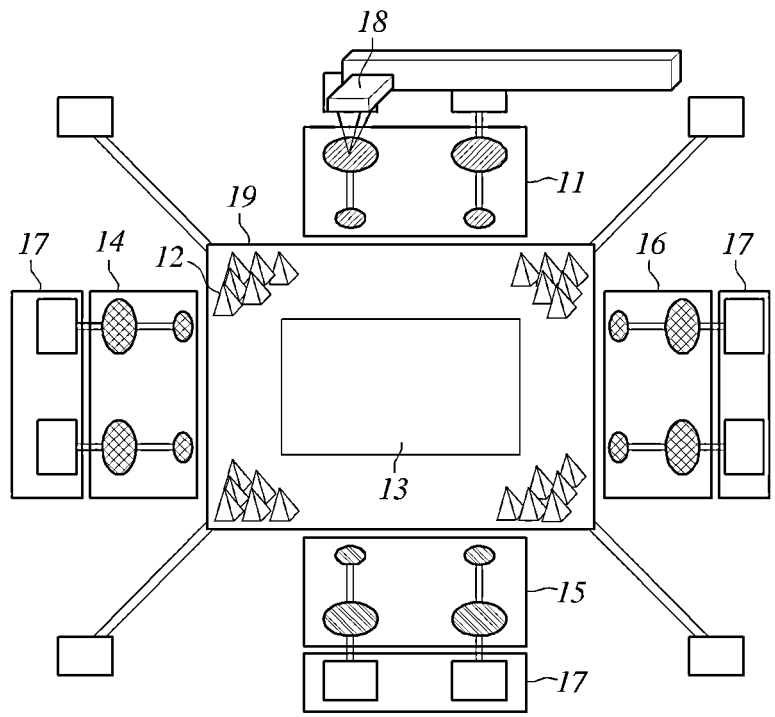
FIGS. 2a to 2k illustrate operations according to a nanopositioning substrate preparation method using the nanopositioning substrate preparation apparatus using a single tip in dip-pen nanolithography according to the first embodiment as illustrated in FIG. 1, in sequential order.
Figure 2B:
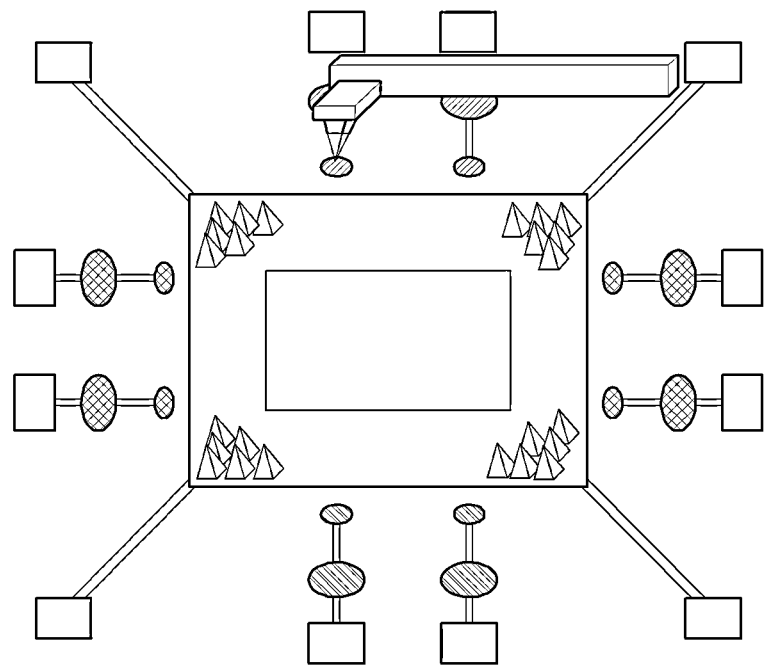
Figure 2C:
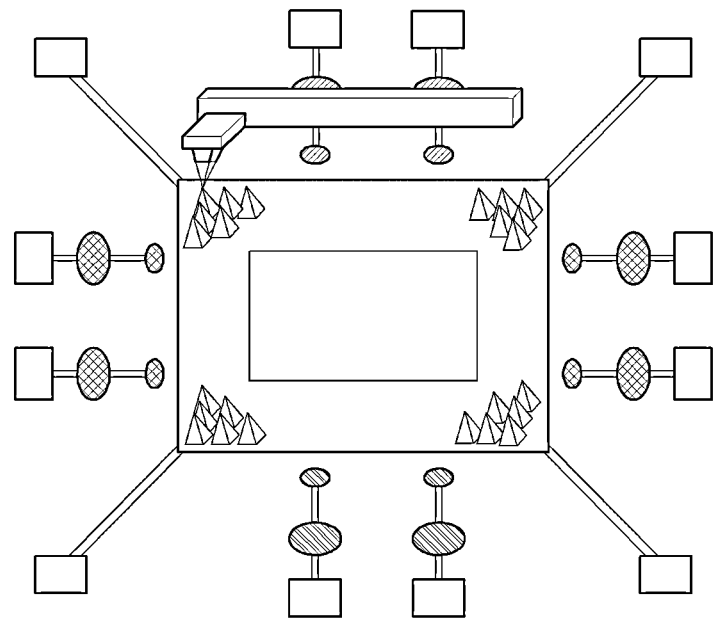
Figure 2D:
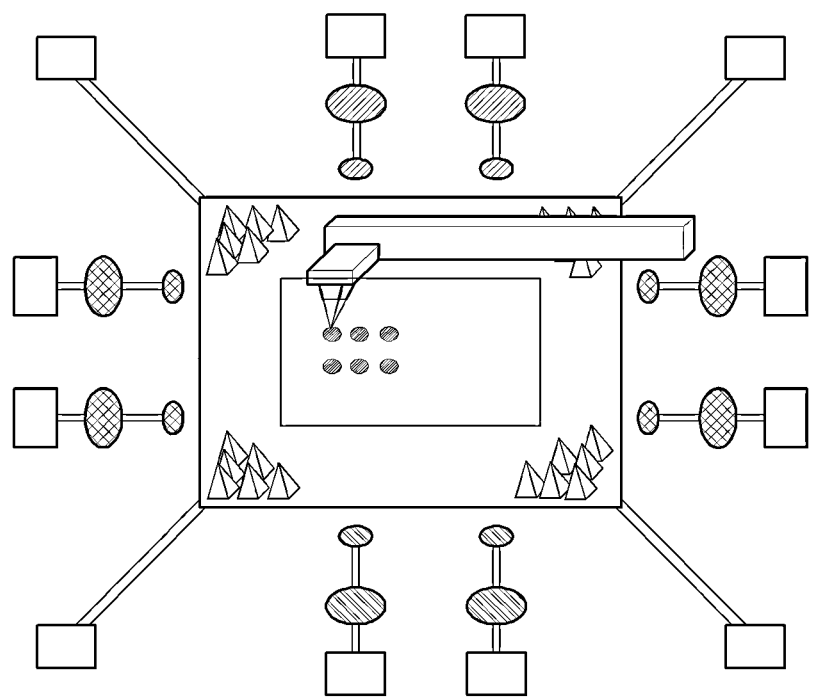
Figure 2E:
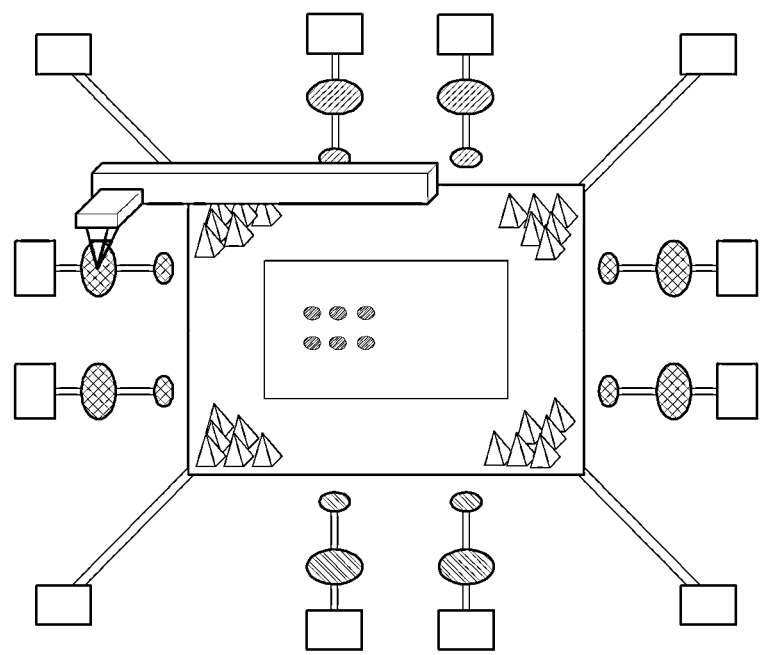
Figure 2F:
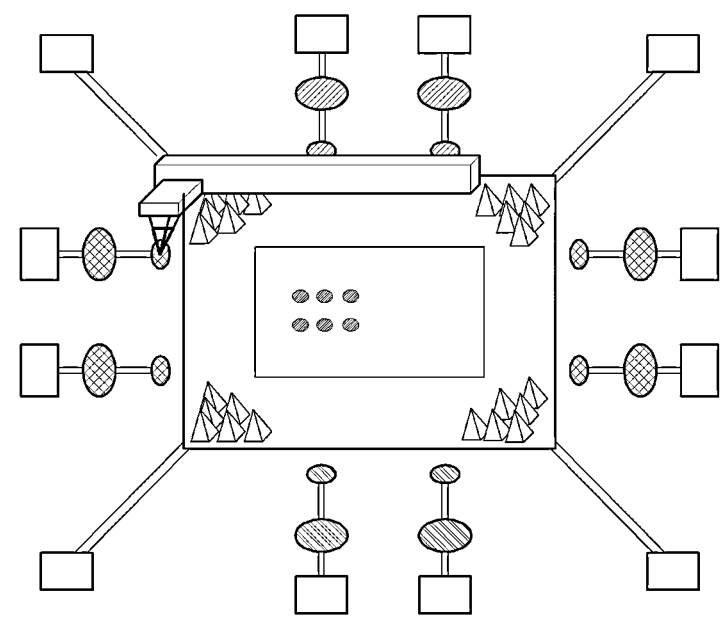
Figure 2G:
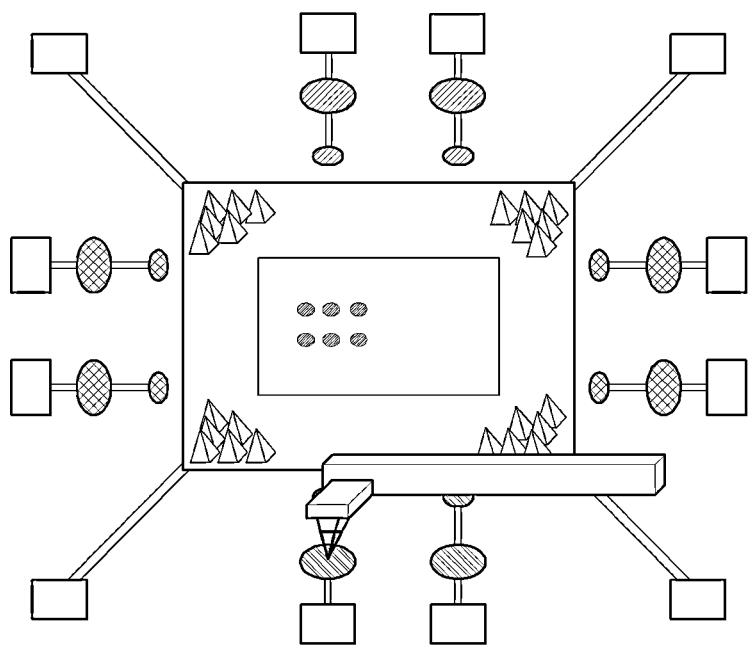
Figure 2H:
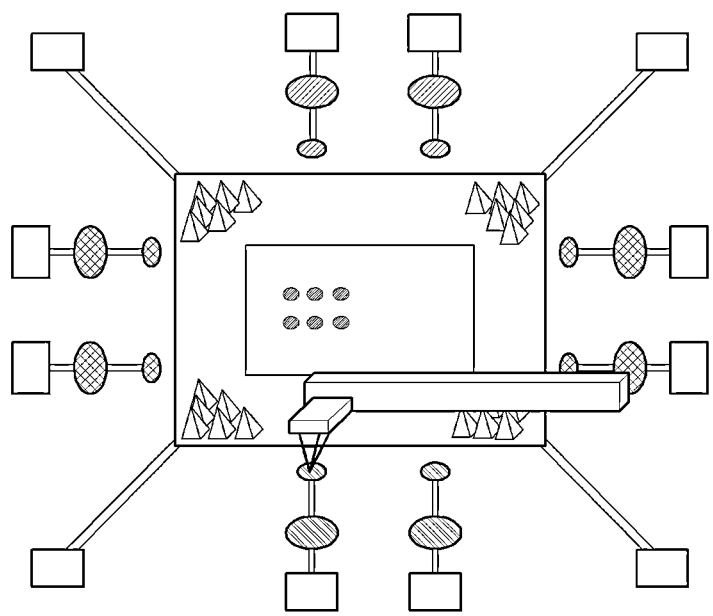
Figure 2I:
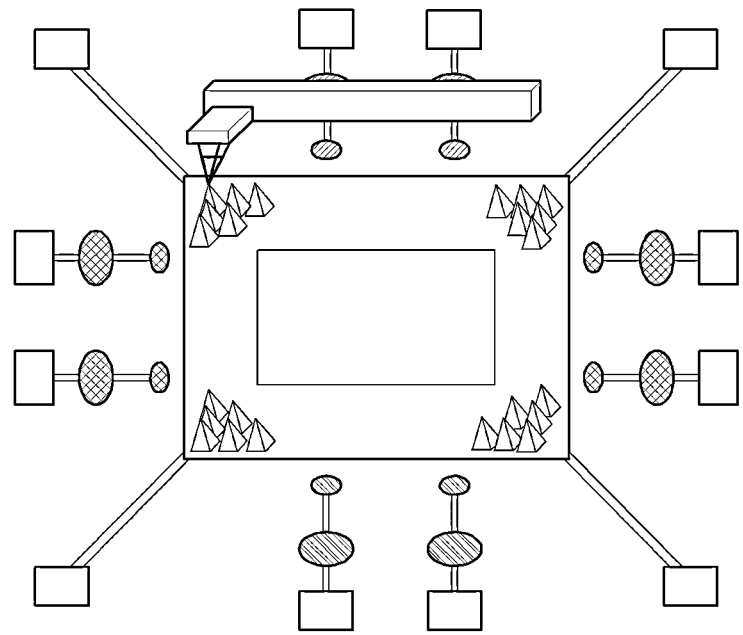
Figure 2J:
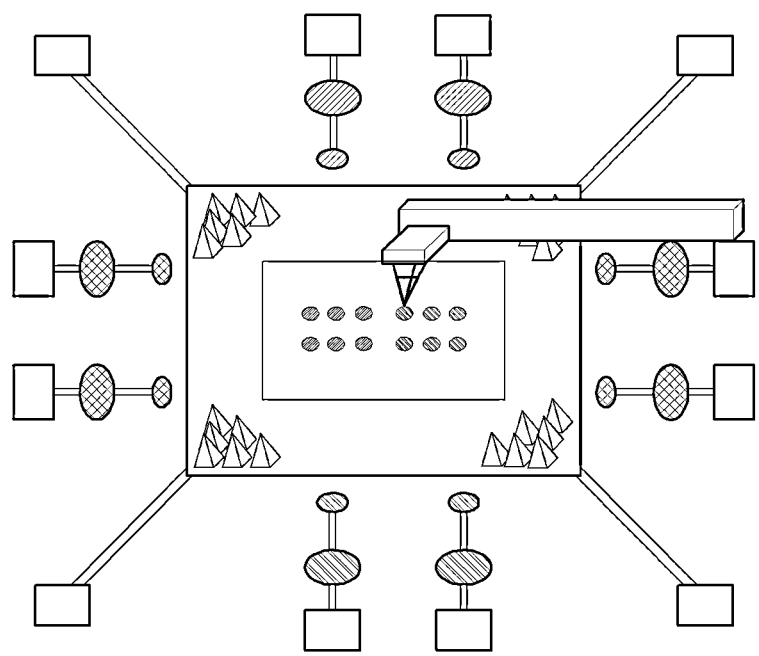
Figure 2K:
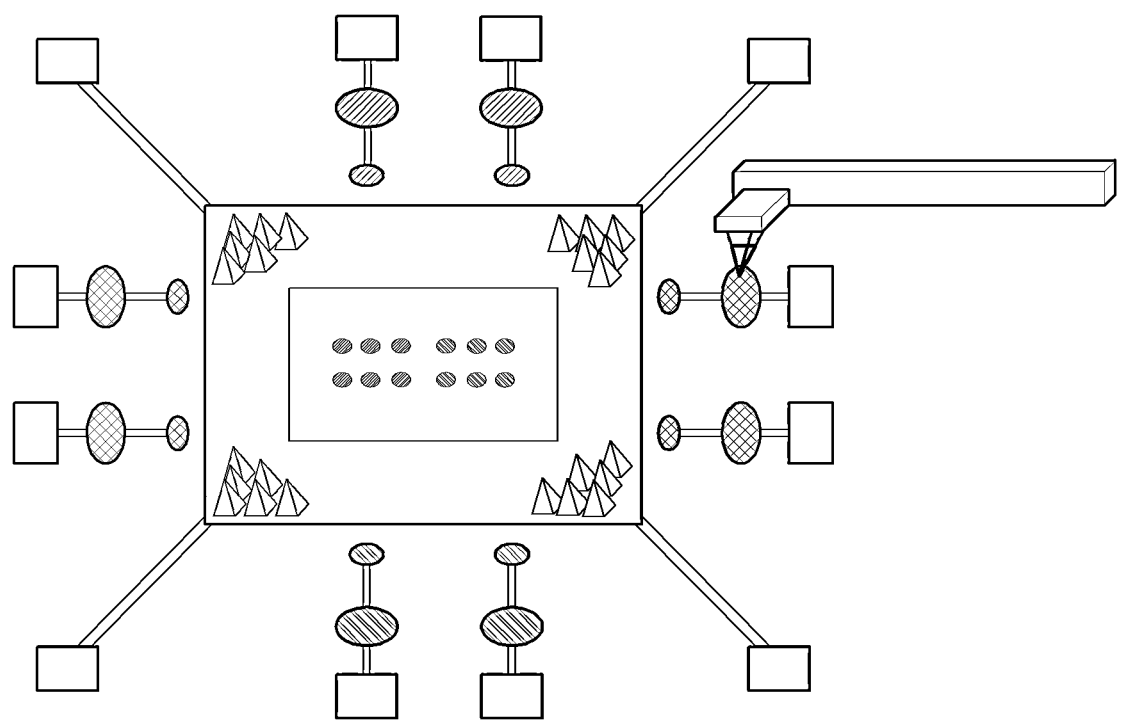
Figure 3:
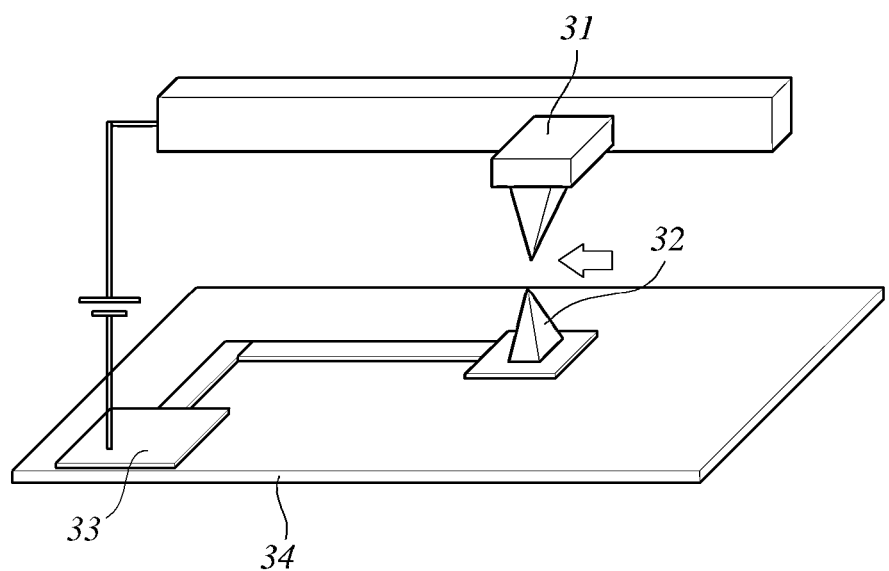
FIG. 3 is a view provided to explain a method for measuring position in accordance with voltage between nanostructure and AFM tip for the purpose of origin alignment of the AFM tip, according to the nanopositioning substrate preparation method using the nanopositionig substrate preparation apparatus using a single tip in the dip-pen nanolithography according to the first embodiment as illustrated in FIG. 1.

Referring to FIGS. 2 and 3, the operation of forming nanopattern on the substrate using the nanopositioning substrate preparation apparatus 10 constructed as explained above, will be explained in detail.

FIGS. 2a to 2k illustrate operations according to a nanopositioning substrate preparation method using the nanopositioning substrate preparation apparatus using a single tip for dip-pen nanolithography according to the first embodiment as illustrated in FIG. 1, in sequential order.

To be more specific, FIG. 2a shows the process in which the AFM tip 18 is placed at the first ink reservoir 11 and coated with ink.

That is, the first ink reservoir 11 is where the AFM tip 18 is coated with a compound, and the same ink may be used in the respective ink reservoirs, or the ink may be different. A commercially available ink or biopolymer material, or a low molecular weight compound may be used as the ink.

Referring to FIG. 2b, it is possible to coat the ink once again to ensure that the is compound coated on the AFM tip 18 is written on the substrate. Additionally, process such as adjusting an amount of ink formed on the AFM tip 18 or contacting electrodes to check the status of the AFM tip 18 may be performed.

It is assumed that the process illustrated in FIG. 2b is performed using the same ink as that used in the process of FIG. 2a is used.

Referring to FIG. 2c, the coated AFM tip 18 is transferred to the position determining portion 12 using a nanostage.

The nanostage may be built-in for the sake of AFM, and be manual or automatic. Generally, the optical microscope provided in the general AFM apparatus may be used to transfer the AFM tip 18 to the proximity of the position determining portion 12.

As illustrated in FIG. 2, there may be six conical structures marked at four positions, but the embodiments are not limited thereto. Accordingly, one or more than one conical structures may be prepared at one or more positions, depending on needs.

Accordingly, the nanostage is driven in accordance with the current characteristics according to voltage applied to the AFM tip 18 positioned approximately above the position determining portion 12, or the bending degree of the AFM tip, to place the AFM tip 18 adjacent to the tip of the conical nanostructure in contactless manner.

Alternatively, it is possible to acquire AFM images at proximity to the position determining portion 12 in a contact manner, and position the AFM tip 18 onto the tip of the conical nanostructures.

Next, referring to FIG. 2d, the AFM tip 18 is moved with reference to the origin as determined in FIG. 2c, so that at the pattern index 13, a desired pattern is written on the substrate 19 using the dip-pen nanolithography principle.

Next, referring to FIG. 2e, the AFM tip 18 written with pattern is transferred to the first cleaning portion 14, under observation with a built-in optical microscope of the AFM, for cleaning process.

The distance of travel may range between several hundred µm and several dozen mm. Alternatively, another stage may be used for the purpose of AFM imaging instead of the nanostage using piezo-driving, like a manual microscope stage or a stage with several tens of mm of distance of travel.

Cleaning the AFM tip 18 may be performed by way of simple contact with the electrode of the first cleaning portion 14 having organic solvent or aqueous solution droplets, or by application of voltage between the first cleaning portion 14 and the AFM tip 18.

For example, in the case of biopolymer material such as DNA that has relatively many negative charges, a negative (−) charge may be applied to thus facilitate transport in a unilateral direction.

Next, referring to FIG. 2f, the AFM tip 18 is cleaned once again to allow easier next loading of the ink.

Next, referring to FIG. 2g, the cleaned AFM tip 18 is brought into contact with the second ink reservoir 15, so that new compound or biopolymer material, as the second ink, is loaded on the AFM tips 18.

Next, referring to FIG. 2h, ink may be coated once again, or the AFM tip 18 may be cleaned once again, to ensure that the new compound coated on the AFM tip 18 is written on the substrate 19. The process is similar to the ink loading process illustrated in FIG. 2b.

Next, referring to FIG. 2i, the newly-coated AFM tip 18 is transported approximately to the position of the position determining portion 12 using the nanostage, and as is explained above with reference to FIG. 2c, the nanostage is driven in accordance with the current characteristics according to the voltage applied to the AFM tip 18 and the position determining portion 12, or the bending degree of the AFM tip 18, to position the AFM tip 18 to the tip of the conical nanostructures, to thereby find the origin.

Referring next to FIG. 2j, the coated AFM tip 18 is transported by the nanostage, and at the pattern index 13, the desired pattern is written on the same position or the position adjacent to the previous pattern, using the ink that is newly loaded, by the contact with the substrate 19.

Referring next to FIG. 2k, after pattern writing, the AFM tip 18 is transported to the second cleaning portion 16 to be cleaned.

Accordingly, as explained above, by repeating the processes of FIGS. 2a to 2k depending on user's need, it is possible to form pattern with maximum density, using a variety of inks on the limited area of the pattern index 13.

Referring continuously to FIG. 3, the method of measuring position according to voltage between the nanostructures and the AFM tip 18 for the purpose of aligning the AFM tip 18 to the origin in the nanopositioning substrate preparation apparatus 10, as illustrated in FIGS. 1 and 2, will be explained below.

That is, referring to FIG. 3, the method for aligning the AFM tip 13 to the origin is performed by determining whether or not the AFM tip 31 is placed at the tip of the nanostructure 32, according to the current characteristic change due to the voltage applied between the nanostructure 32 and the AFM tip 31, or the bending degree of the AFM tip 31.

To be more specific, to fine-adjust the position of the AFM tip, the built-in nanostage of the AFM apparatus is generally used. According to the present invention, the origin is can be found without requiring contact between the AFM tip 31 and the nanostructure 32, by using the current characteristic changes and the bending degree of the AFM tip 31.

In another embodiment, it is possible to acquire the AFM image of small area using the AFM tip 31 transported approximately to the position above the nanostructure 32, and to thus position the AFM tip 31 to above the tip of the nanostructures 32, in which case the method may be performed in a contact manner to align to the origin, in a manner of minimizing cross-contamination of the pattern index 13.

According to an embodiment of the present invention, among several silicon wafers, a particular p-type silicon substrate having a crystal plane (100) and resistivity of 10-35 p is used, to prepare three-dimensional (3D) nanostructures for the purpose of operating as reference position as explained above.

That is, after the initial cleaning, 1000 dots are deposited using tetramethylammonium hydroxide (TMAH) etching, using $Si_3N_4$ film as a masking material, with low pressure chemical vapor deposition (LPCVD).

After that, the wafer with the nitrate film deposited thereon is cleaned with acetone, ethanol, and triple distilled water, in order. For the purpose of stronger adhesive force of the photosensitive film, an oxygen ($O_2$) plasma process is performed with a 500 W bias, for 40 sec.

Next, the pattern area is defined using the photoresist (AZ5214 PR), and the undeveloped photosensitive film is removed by the $O_2$ plasma process with 300 W bias for 20 min.

After that, the nitrate film is etched by reactive ion etching (RIE), which is performed for 4 minutes, with 25 sccm $CF_4$ gas and a 60 W bias.

For example, the specific portion of the nitrate film as indicated in FIGS. 2a to 2k remains, and the position determining portion 12 and the pattern index 13 are defined two-dimensionally.

After that, by adding 30% IPA (Isopropyl alcohol) to 4 wt %, 80 TMAH aqueous solution, and allowing the same to react for 30 min, the nanostructures 32 of the position determining portion 12 are formed, and the pattern index 13 area forms a planar and protruding table.

The plurality of nanostructures 32 may have a three dimensional shape such as a cone, quadrangular pyramid, or cylinder, and may be formed from silicon, silicon rubber, silicon resin, polydimethylsiloxane, or glass substrate.

That is, in order to form the nanostructures 32 on a substrate formed from a variety of materials, the silicon substrate prepared as explained above is used as a negative plate, and then a mold with opposite shade to the nanostructures 32 is prepared by evenly applying polydimethylsiloxane (PDMS) elastic material over the entire area that includes the position determining portion 12 and the pattern index 13.

A variety of polymer materials such as silicon resin with fluidity is hardened on top of the PDMS negative mold, and then a gold electrode is formed with an E-beam evaporator. As a result, it is possible to prepare nanopositioning substrate with the same 3D structure as the nanostructures 32 explained above, but with a variety of properties.

As explained above, by coating the 3D nanostructures 32 in the form such as a cone, a quadrangular pyramid or a cylinder with a gold (Au) electrode, the substrate 34 having similar structure as the silicon naopositioning substrate explained above, i.e., the substrate 34 having the AFM tip 31 and the electrode 33 to apply voltage, can be completed.

Accordingly, after coating ink on the tips with a single tip or multiple tips, the nanostructures to align positions of the AFM tip is used to thus align the AFM tip above the reference points (origins) using the nanostructures for AFM tip position alignment, after which the AFM tip is transferred to the pattern index by a predetermined distance, to be indexed.

Accordingly, repeated use of a variety of inks is possible, and for the colors of the inks in the first and second ink reservoirs 11, 15, or other additional ink reservoirs, the ink reservoirs may be arranged in the order of red, orange, yellow, green, blue, navy, and purple, or the reservoirs may be in identical color.

That is, after the nanopattern is formed using one type of ink, the a single tip or multiple tips may be moved approximately to the position of the cleaning portion for cleaning, after which the tips are moved to the reference positions for reference position alignment.

Accordingly, referring to FIG. 3, because the gold electrode 33 is formed on top of the substrate 34, a voltage is applied to the single AFM tip 31, or between the multiple AFM tips 31, and it is possible to measure the positions of the AFM tips 31 with reference to the nanostructures 32, using current change/AFM tip bending change/AFM imaging, which may occur in accordance with the voltage between the AFM tips 31, and also to align the AFM tips 31 to the origins, because the tips of the nanostructures 32 can be found using the built-in nanostage.

Figure 4:
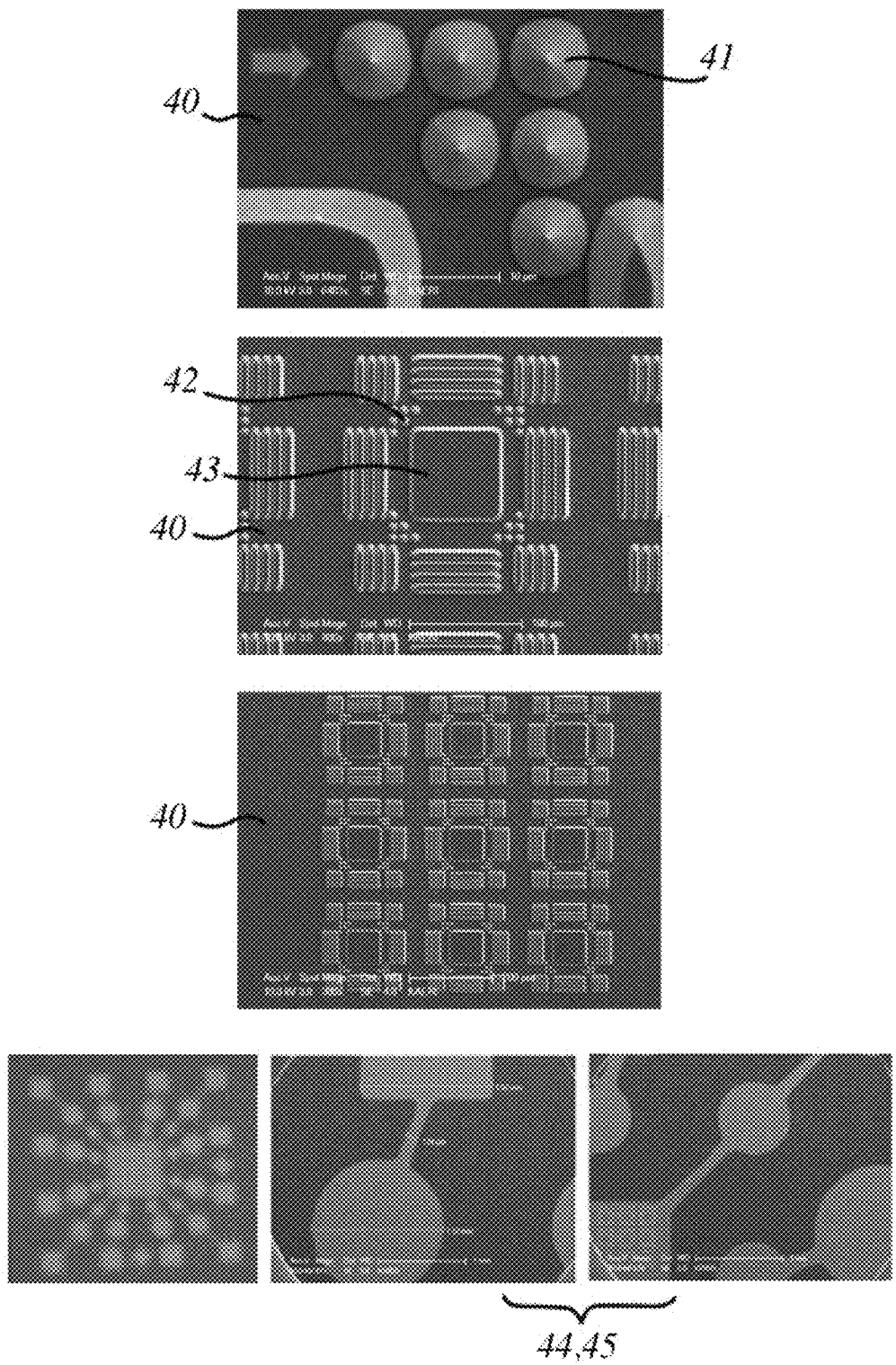
FIG. 4 illustrates the constitution of the nanopositionig substrate prepared by the nanopositioning substrate preparation apparatus using a single tip in the dip-pen nanolithography according to the first embodiment as illustrated in FIG. 1.

FIG. 4 illustrates the constitution of the nanopositionig substrate prepared by the nanopositioning substrate preparation apparatus using a single tip in the dip-pen nanolithography, according to the first embodiment as illustrated in FIG. 1.

Referring to FIG. 4, on the substrate 40 prepared by the nanopositioning substrate preparation apparatus 10 according to the first embodiment, there may be formed a conical nanostructure 41, a position determining portion 42, a pattern index 43, and a first and second ink reservoirs 44, 45.

Next, referring to FIGS. 5 and 6, a nanopositioning substrate preparation apparatus using a single tip or multiple tips with dip-pen nanolithography, using AFM, according to the second embodiment, and the preparation method thereof will be explained in detail.

Figure 5:
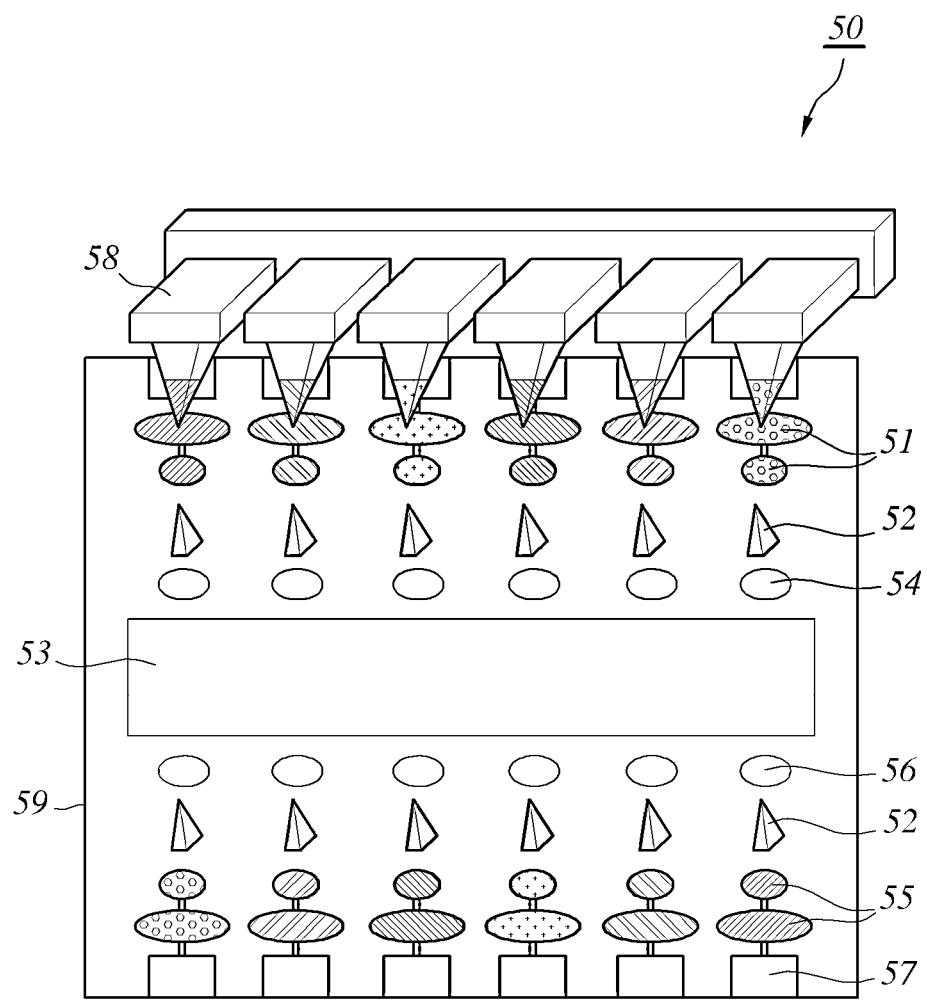
FIG. 5 is a schematic overall view of a nanopositioning substrate preparation apparatus using multiple tips in the dip-pen nanolithography, according to a second embodiment.

FIG. 5 is a schematic overall view of a nanopositioning substrate preparation apparatus 50 using multiple tips in the dip-pen nanolithography, according to a second embodiment.

For convenience of explanation, only the differences of the second embodiment from the nanopositioning substrate preparation apparatus 1 according to the first embodiment will be explained below, while the like or identical elements or structures will be referred to the explanation provided above.

Referring to FIG. 5, the nanopositioning substrate preparation apparatus 50 using multiple tips, according to the second embodiment, is similar to the nanopositioning substrate preparation apparatus according to the first embodiment, in that it includes a first ink reservoir 51, a position determining portion 52, a pattern index 53, a first cleaning portion 54, a second ink reservoir 55, a second cleaning portion 56, an electrode connection portion 57, an AFM tip 58, and a substrate 59, but is distinct from the first embodiment in that it includes a plurality of AFM tips 58, and also a plurality of first ink reservoirs 51, position determining portions 52, first cleaning portions 54, second ink reservoirs 55, second cleaning portions 56, and the electrode connection portions 57, to correspond to the plurality of AFM tips 58.

Using the nanopositioning substrate preparation apparatus 50 using multiple tips constructed as explained above, according to the second embodiment, it is possible to form a plurality of patterns with increased ease using several inks, which will be explained below.

FIGS. 6a to 6j illustrate respective operations according to a nanopositioning substrate preparation method using an ink system using multiple tips in the dip-pen nanolithography, according to the second embodiment as illustrated in FIG. 5.

Like the operation of the nanopositioning substrate preparation apparatus 50 according to the first embodiment explained above with reference to FIGS. 2a to 2k, the nanopositioning substrate preparation apparatus 50 using multiple tips according to the second embodiment also coats ink on the AFM tips, writes patterns, cleans the tips, and again writes patterns with another ink.

Figure 6A:
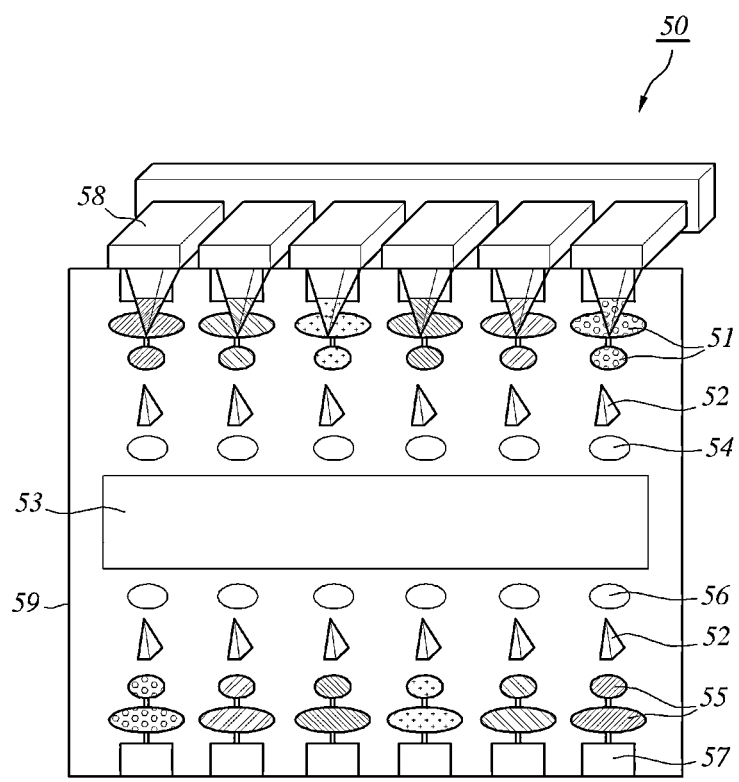
FIGS. 6a to 6j illustrate respective operations according to a nanopositioning substrate preparation method using an ink system using multiple tips in the dip-pen nanolithography according to the second embodiment as illustrated in FIG. 5.
Figure 6B:
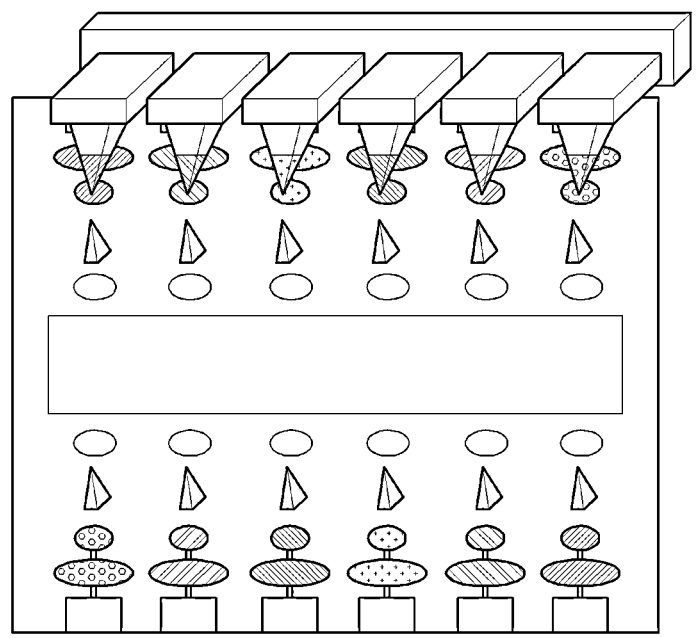

To be specific, referring to FIGS. 6a to 6b, ink is coated on the corresponding AFM tips 58 with the respective first ink reservoirs 51.

Figure 6C:
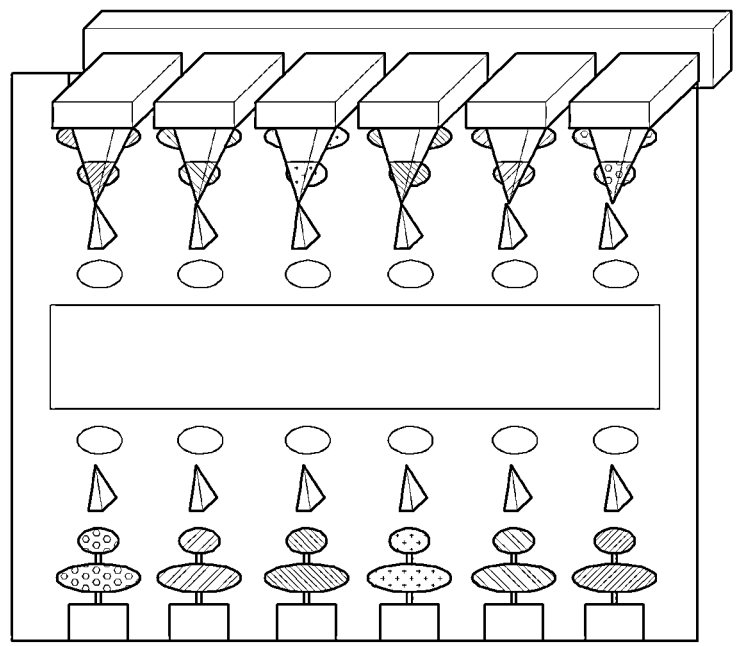

Referring to FIG. 6c, the respective AFM tips 58 are placed approximately above the respective position determining portions 52, as the reference positions of the tip positioning, using the optical microscope provided in the AFM. A proper voltage is applied to the AFM tips 58, and the nanostructures of the position determining portions 52, and characteristics of electric currents flowing the AFM tips 58 are observed, or the positions of the AFM tips 58 are determined using the bending degrees of the AFM tips 58, so that the AFM tips 58 are placed at the tips of the nanostructures of the position determining portions 52, using a nanostage.

The position determining portions 52 can determine position within a distance of several hundred μm and several hundred μm, to the positions coated with ink.

Figure 6D:
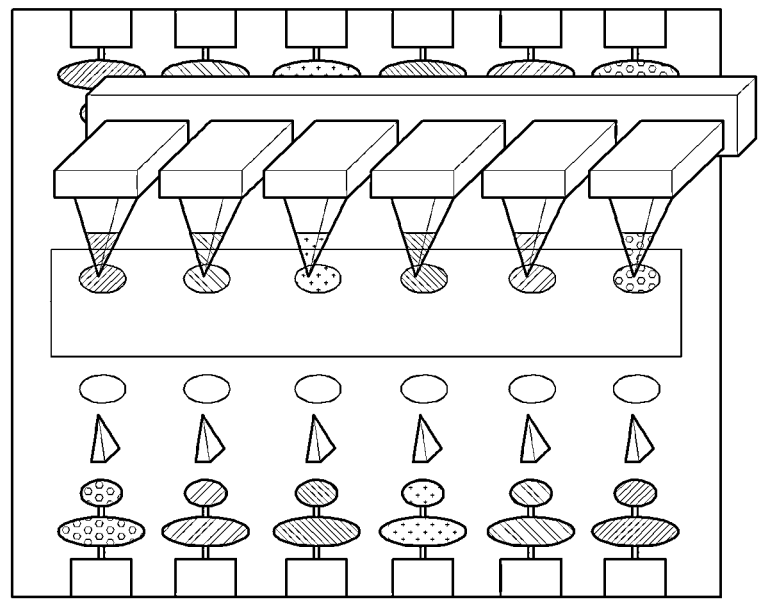
Figure 6E:
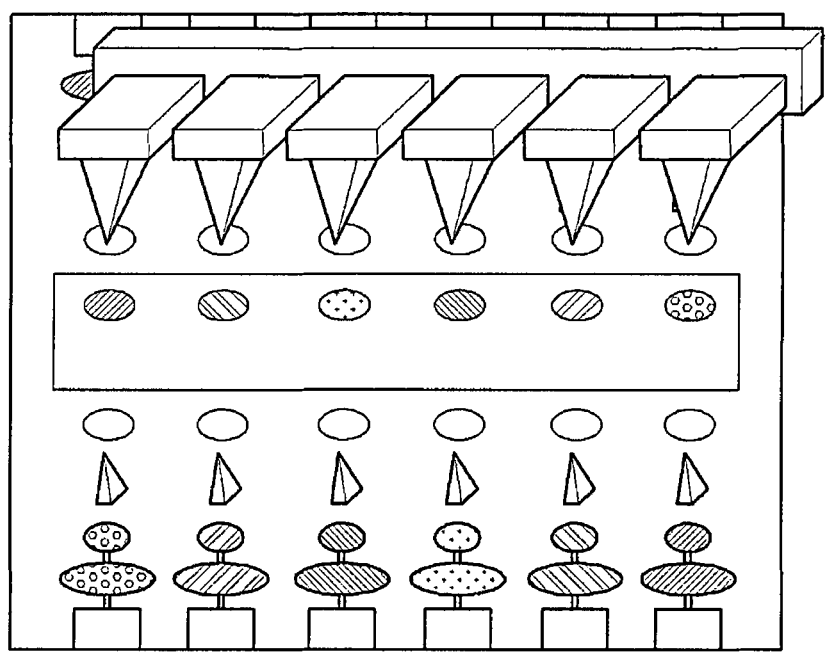
Figure 6F:
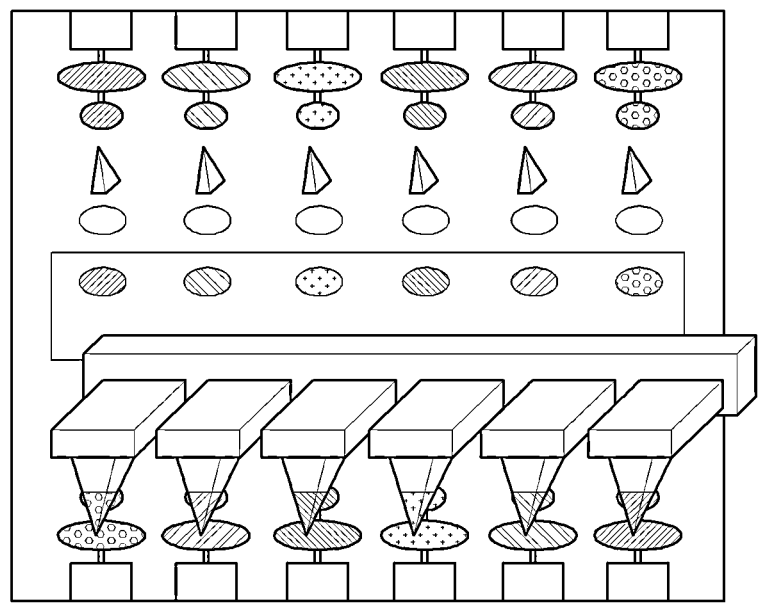
Figure 6G:
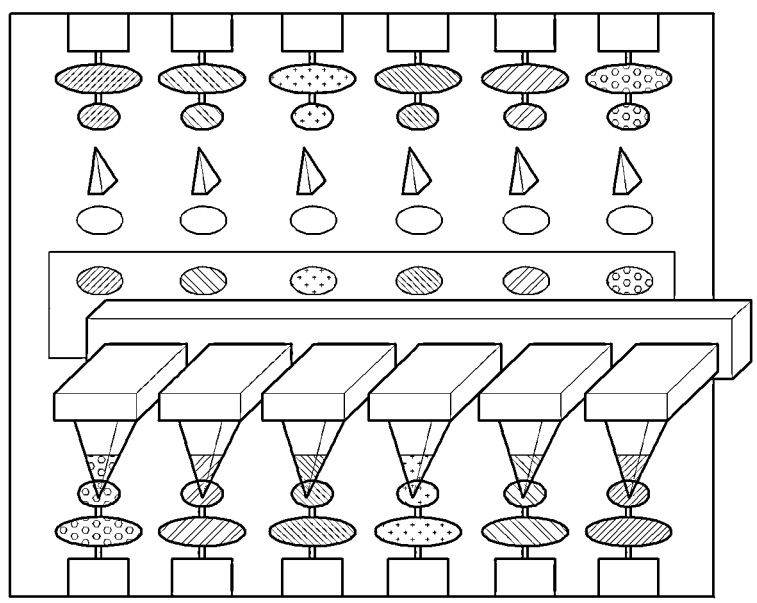
Figure 6H:
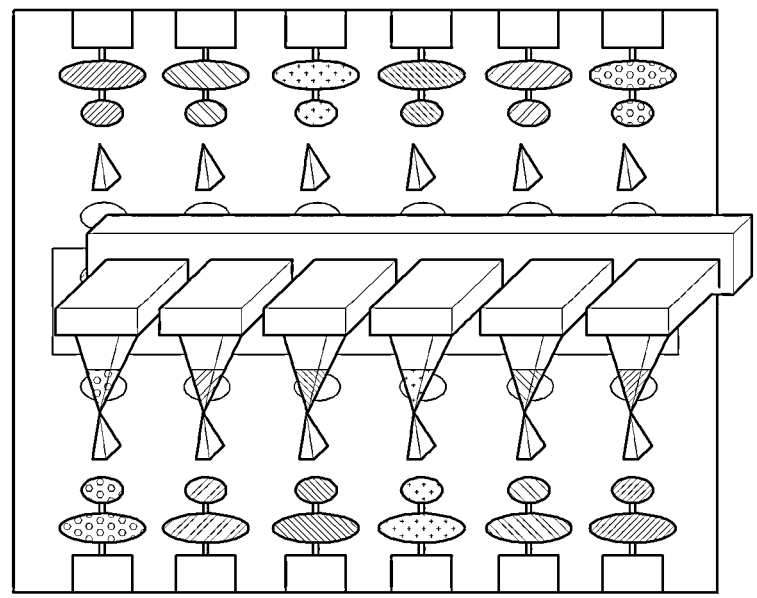
Figure 6I:
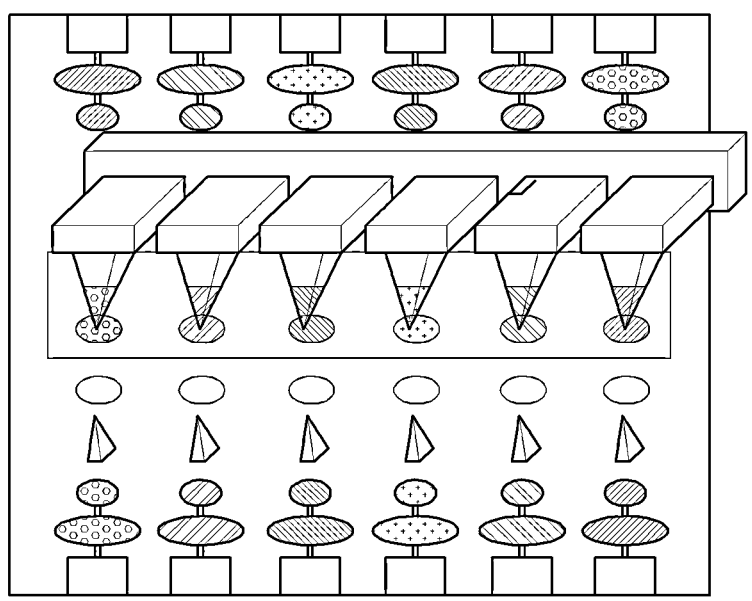
Figure 6J:
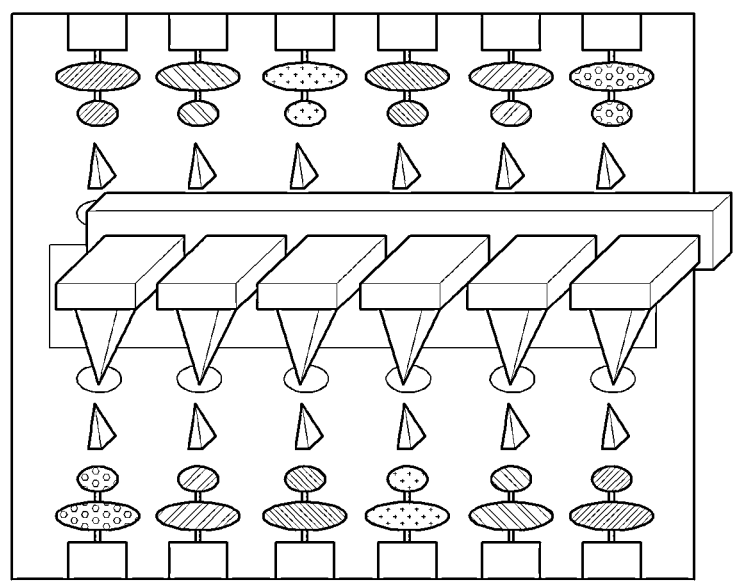

Next, referring to FIG. 6d, the coated AFM tips 58 are moved, form a pattern at the pattern index 53, and referring to FIG. 6e, cleaned at the first cleaning portions 54, respectively.

Referring now to FIGS. 6f to 6i, the AFM tips 58 are moved to the second ink reservoirs 55 where the AFM tips 58 are coated with ink in the same manner as at the first ink reservoirs 51, and moved again to the position determining portions 52 to be aligned, and repeat the patterning process.

After that, the AFM tips 58 are cleaned again at the second cleaning portions 56 and return to the operation step as illustrated in FIG. 6a, to repeat the processes explained above, until desired patterns are completed.

The processes explained so far may be repeatedly performed, depending on the type of the ink.

According to the processes explained above, it is possible to provide a nanopositioning substrate preparation apparatus using a single tip or multiple tips for dip-pen nanolithography using AFM, and a preparation method thereof.

The nanopositioning substrate preparation apparatus using a single tip or multiple tips for dip-pen nanolithography using AFM and a preparation method thereof according to certain embodiments have been explained, but not limited thereto. Accordingly, various corrections, modifications, combinations and replacements are possible depending on needs for design or for other various considerations by those with general knowledge in the technical field to which the invention pertains.

As explained above, according to the present invention, since multiple biomaterials are integrated in the glass substrate using position reproducibility of the AFM tips, a nanopositioning substrate preparation apparatus using a single tip or multiple tips for dip-pen nanolithography using AFM and a preparation method thereof according to the present invention can increase density of the biomaterials at an area of μm all scale.

Further, according to the present invention, a nanopositioning substrate preparation apparatus using a single tip or multiple tips for dip-pen nanolithography using AFM and a preparation method thereof are provided, from which a large area (to 20 mm) nanopositioning system can be commercialized, which may have glass substrate patterned with a gold electrode and interoperable with AFM.

Furthermore, according to the present invention, a nanopositioning substrate preparation apparatus using a single tip or multiple tips for dip-pen nanolithography using AFM and a preparation method thereof are provided, which enables actual implementation of an extra high density and very high capacity biochip.

Furthermore, according to the present invention, a nanopositioning substrate preparation apparatus using a single tip or multiple tips for dip-pen nanolithography using AFM and a preparation method thereof, are provided, which enable re-alignment of positions of target biomolecules for the purpose of the study of new properties.

Furthermore, according to the present invention, a nanopositioning substrate preparation apparatus using a single tip or multiple tips for dip-pen nanolithography using AFM and a preparation method thereof are provided, which can enable interactions among biomolecules in fields such as biochemistry, biology, or neuroscience, by providing a platform to observe interaction among a variety of biomolecules immobilized on a glass substrate in a real time basis.

The invention claimed is:

1. A nanopositioning substrate preparation apparatus comprising:
   a substrate;
   a pattern index disposed on the substrate;
   an atomic force microscope (AFM) tip configured to form a pattern on the pattern index;
   a first ink reservoir disposed on the substrate and configured to coat the AFM tip with a first ink;
   a position determining portion disposed on the substrate and configured to interact with the AFM tip;
   a first cleaning portion disposed on the substrate and configured to remove the first ink from the AFM tip;
   a second ink reservoir disposed on the substrate and configured to coat the AFM tip with a second ink;
   a second cleaning portion disposed on the substrate and configured to remove the second ink from the AFM tip; and
   an electrode connecting portion configured to apply a voltage to the position determining portion, in order to determine a position of the AFM tip when the AFM tip interacts with the position determining portion,
   wherein the AFM tip is configured to interact with the position determining portion, prior to forming the pattern using the first and second inks.

2. The nanopositioning substrate preparation apparatus of claim 1, wherein:
   the first and second inks are identical or different; and
   the first and second inks comprise a low molecular weight compound or a biopolymer material comprising DNA or protein.

3. The nanopositioning substrate preparation apparatus of claim 1, wherein the first and second ink reservoirs each comprise two or more ink reservoirs configured to contain the first and second inks.

4. The nanopositioning substrate preparation apparatus of claim 1, wherein:
   the AFM tip is configured to use the position determining portion as a reference position, in order to correct for positional deviations of the AFM tip, by checking positions based on voltage-current by detecting a change in the applied voltage, a bending degree of the AFM tip according to the applied voltage, or an AFM image.

5. The nanopositioning substrate preparation apparatus of claim 4, wherein:
   the position determining portion comprises a three dimensional nanostructure shaped as a cone, a quadrangular pyramid, a triangular pyramid, or a cylinder;
   a gold (Au), silver (Ag), or copper (Cu) electrode is formed on the nanostructure; and
   the first ink reservoir and the second ink reservoir comprise Au, Ag, or Cu electrodes coated with a hydrogel.

6. The nanopositioning substrate preparation apparatus of claim 1, further comprising a gold electrode to connect the pattern index and the position determining portion to an external power source.

7. The nanopositioning substrate preparation apparatus of claim 1, wherein:
   the first and second cleaning portions comprise two or more cleaning portions to repeatedly cleaning the AFM tip; and
   the first and second cleaning portions comprise an aqueous solution or organic solvent, and are configured to apply a voltage to the AFM tip when cleaning the AFM tip.

8. The nanopositioning substrate preparation apparatus of claim 1, further comprising an electric line comprising a conductive adhesive or a conductive solder, the electric line configured to apply a voltage to the first and second cleaning portions and the first and second ink reservoirs.

9. The nanopositioning substrate preparation apparatus of claim 1 wherein:
   the substrate comprises silicon, a silicon rubber, a silicon resin, polydimethylsiloxane, or a glass; and
   the substrate comprises a protrusion or a recess formed thereon.

10. The nanopositioning substrate preparation apparatus of claim 1, wherein the apparatus further comprises N of each of the AFM tip, first ink reservoir, second ink reservoir, position determining portion, first cleaning portion, and second cleaning portion, (N being a natural number greater than 1).

11. A nanopositioning substrate preparation method using the nanopositioning substrate preparation apparatus according to claim 1, the method comprising:
   positioning the AFM tip at the first ink reservoir and coating the first ink on the AFM tip;
   positioning the AFM tip at the position determining portion and using an interaction between the position determining portion and the AFM tip, to determine a first origin of the AFM tip;
   positioning the AFM tip at the pattern index, with reference to the first origin, and applying the first ink to the pattern index;
   positioning the AFM tip to the first cleaning portion to remove a residual amount of the first ink;
   positioning the AFM tip at the second ink reservoir and coating the second ink on the AFM tip;
   positioning the AFM tip at the position determining portion and using an interaction between the position determining portion and the AFM tip, to determine a second origin of the AFM tip;
   positioning the AFM tip at the pattern index, with reference to the second origin, and applying the second ink to the pattern index;
   positioning the AFM tip at the second cleaning portion to remove a residual amount of the second ink; and
   repeating the above-mentioned processes until a pattern is formed on the pattern index.

12. The nanopositioning substrate preparation method of claim 11, wherein:
   the first and second ink reservoirs comprise two or more ink reservoirs to repeatedly load the first and second inks on the AFM tip;
   the first and second inks are the same or different from each other; and
   the first and second inks comprise a low molecular weight compound or a biopolymer material comprising DNA or protein.

13. The nanopositioning substrate preparation method of claim 11, wherein:
   the position determining portion comprises a three dimensional nanostructure shaped as a cone, a quadrangular pyramid, a triangular pyramid, or a cylinder;
   a gold (Au), silver (Ag) or copper (Cu) electrode is formed on the nanostructure, and
   the determining of the first and second origins comprises positioning the AFM tip in accordance with an electric current characteristic of the voltage applied to the AFM tip from the position determining portion, a bending degree of the AFM tip, or by using an AFM image.

14. The nanopositioning substrate preparation method of claim 11, wherein the position determining portion comprises a gold electrode connected to an external power source.

15. The nanopositioning substrate preparation method of claim 11, wherein:
the removal of the first and second inks comprises repeatedly cleaning the AFM tip with an organic solvent or aqueous solution disposed in the first and second cleaning portions, while a voltage is applied to the first and second cleaning portions.

16. The nanopositioning substrate preparation method of claim 15, wherein an electrode connection portion is used to apply voltage to the first and second cleaning portions.

17. The nanopositioning substrate preparation method of claim 11, wherein:
the substrate comprises silicon, a silicon rubber, a silicon resin, a polydimethylsiloxane, or a glass; and
the substrate comprises a protrusion or a recess.

18. The nanopositioning substrate preparation method of claim 11, wherein:
the nanopositioning substrate preparation apparatus comprises N of each of the AFM tip, first ink reservoir, second ink reservoir, position determining portion, first cleaning portion, and second cleaning portion, (N being a natural number greater than 1), and
the method comprises positioning the AFM tips with respect to corresponding ones of the first ink reservoirs, second ink reservoirs, position determining portions, first cleaning portions, and second cleaning portions.

* * * * *